United States Patent
Park et al.

(10) Patent No.: US 8,582,314 B2
(45) Date of Patent: Nov. 12, 2013

(54) INTERCONNECTION STRUCTURE, INTERPOSER, SEMICONDUCTOR PACKAGE, AND METHOD OF MANUFACTURING INTERCONNECTION STRUCTURE

(75) Inventors: Seung Wook Park, Gyunggi-do (KR); Young Do Kweon, Seoul (KR); Seung Wan Shin, Gyunggi-do (KR); Mi Jin Park, Gyunggi-do (KR); Kyung Seob Oh, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 251 days.

(21) Appl. No.: 12/805,628

(22) Filed: Aug. 10, 2010

(65) Prior Publication Data

US 2011/0176285 A1 Jul. 21, 2011

(30) Foreign Application Priority Data

Jan. 19, 2010 (KR) ........................ 10-2010-0004850

(51) Int. Cl.
*H05K 1/11* (2006.01)

(52) U.S. Cl.
USPC ........... 361/803; 361/767; 361/783; 361/758; 361/742; 361/795; 174/256; 174/257; 174/258

(58) Field of Classification Search
USPC .................... 361/767, 783, 758, 742
See application file for complete search history.

(56) References Cited

U.S. PATENT DOCUMENTS

| | | | | |
|---|---|---|---|---|
| 2,774,014 | A * | 12/1956 | Henry, Jr. | 361/729 |
| 6,624,505 | B2 | 9/2003 | Badehi | |
| 2002/0180027 | A1* | 12/2002 | Yamaguchi et al. | 257/700 |
| 2005/0104179 | A1 | 5/2005 | Zilber et al. | |
| 2005/0205997 | A1 | 9/2005 | Yamamoto et al. | |
| 2005/0236562 | A1* | 10/2005 | Kuhmann et al. | 250/239 |
| 2007/0035001 | A1* | 2/2007 | Kuhmann et al. | 257/680 |
| 2008/0001269 | A1* | 1/2008 | Hsu et al. | 257/678 |
| 2011/0127680 | A1* | 6/2011 | Masuda et al. | 257/779 |

* cited by examiner

*Primary Examiner* — Tuan T Dinh
*Assistant Examiner* — Steven Sawyer

(57) ABSTRACT

There is provided an interconnection structure. An interconnection structure according to an aspect of the invention may include: a plurality of side portions provided on one surface of a substrate part and a plurality of cavities located between the side portions and located further inward than the side portions; and electrode pattern portions provided on surfaces of the side portions and the cavities.

5 Claims, 3 Drawing Sheets

INTERCONNECTION STRUCTURE, INTERPOSER, SEMICONDUCTOR PACKAGE, AND METHOD OF MANUFACTURING INTERCONNECTION STRUCTURE

CROSS-REFERENCE TO RELATED APPLICATIONS

This application claims the priority of Korean Patent Application No. 10-2010-0004850 filed on Jan. 19, 2010, in the Korean Intellectual Property Office, the disclosure of which is incorporated herein by reference.

BACKGROUND OF THE INVENTION

1. Field of the Invention

The present invention relates to an interconnection structure, an interposer, a semiconductor package, and a method of manufacturing an interconnection structure, and more particularly, to an interconnection structure interconnecting a semiconductor chip, a circuit board, an IC chip, a microelectro mechanical systems (MEMS), and an interposer, an interposer including the interconnection structure, a semiconductor package including the interposer, and a method of manufacturing the interconnection structure.

2. Description of the Related Art

One of the most important trends in recent technical developments in the semiconductor industry is to reduce the size of semiconductor devices.

In order to manufacture small, lightweight and thin components, a technique aimed at reducing the sizes of individual components being mounted, a system on chip (SOC) technique aimed at integrating a plurality of individual devices into a single chip, and a system in package (SIP) technique aimed at integrating a plurality of individual devices into a single package are required. Rerouting or redistribution may be used in order to realize these techniques.

Therefore, this semiconductor package can reduce the amount of wiring used to interconnect electronic components and thereby realize high density wiring. Furthermore, through the mounting of electronic components, this semiconductor package increases the surface area of a circuit board and has excellent electrical characteristics.

Here, an interposer arranged inside a semiconductor package includes an insulating substrate formed of glass-epoxy resin. An island, to which a semiconductor chip is bonded, and internal terminals, electrically connected to a pad on the surface of the semiconductor chip by wire bonding, are disposed on one surface of the insulating substrate.

External terminals, shaped like balls, are aligned on the other surface of the insulating substrate so that the external terminals may be electrically connected to lands (electrodes) on a mounting substrate (printed circuit board).

Through holes, passing through both surfaces of the insulating substrate, are formed in the insulating substrate, and are filled with a metallic material. The metallic material, filling the through holes, provides electrical connections between the internal terminals on the one surface of the insulating substrate and the external terminals on the other surface thereof.

Recently, however, a reduction in the size of a semiconductor package has called for fine pitch electrical interconnections. Also, there is a need for techniques to solve these problems.

SUMMARY OF THE INVENTION

An aspect of the present invention provides an interconnection structure having electrode pattern portions provided on side portions and cavities, arranged in a zigzag pattern, to thereby establish fine pitch electrical interconnections, an interposer having the interconnection structure, a semiconductor package, and a method of manufacturing the interconnection structure.

According to an aspect of the present invention, there is provided an interconnection structure including: a plurality of side portions provided on one surface of a substrate part and a plurality of cavities located between the side portions and located further inward than the side portions; and electrode pattern portions provided on surfaces of the side portions and the cavities.

The surfaces of the cavities may be disposed in parallel with the surfaces of the side portions.

The one surface of the substrate part may have an area different from that of the other surface thereof.

According to another aspect of the present invention, there is provided an interposer including: a substrate part having a plurality of side portions on one surface thereof and a plurality of cavities located between the side portions and located further inward than the side portions; and electrode pattern portions provided on surfaces of the side portions and the cavities to thereby electrically connect a circuit board and a semiconductor chip to each other.

The surfaces of the cavities may be disposed in parallel with the surfaces of the side portions.

The one surface of the substrate part may have an area different from that of the other surface thereof.

According to another aspect of the present invention, there is provided a semiconductor package including: a semiconductor chip having an electrode portion on one surface thereof; a circuit board electrically connected to the semiconductor chip; and an interposer having a substrate part including a plurality of side portions provided on one surface thereof and a plurality of cavities located between the side portions and located further inward than the side portions, and electrode pattern portions provided on surfaces of the side portions and the cavities so as to electrically connect the circuit board and the semiconductor chip to each other.

The surfaces of the cavities may be disposed in parallel with the surfaces of the side portions.

The one surface of the substrate part may have an area different from that of the other surface thereof.

According to another aspect of the present invention, there is provided method of manufacturing an interconnection structure, the method including: forming an etching passivation layer on a substrate part; forming side portions and cavities, located between the side portions and located further inward than the side portions, by performing etching on one surface of the substrate part; and forming electrode pattern portions on the side portions and the cavities.

The substrate part may be any one of a circuit board, a semiconductor chip, a micro-electro mechanical system (MEMS), an IC device, and an interposer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
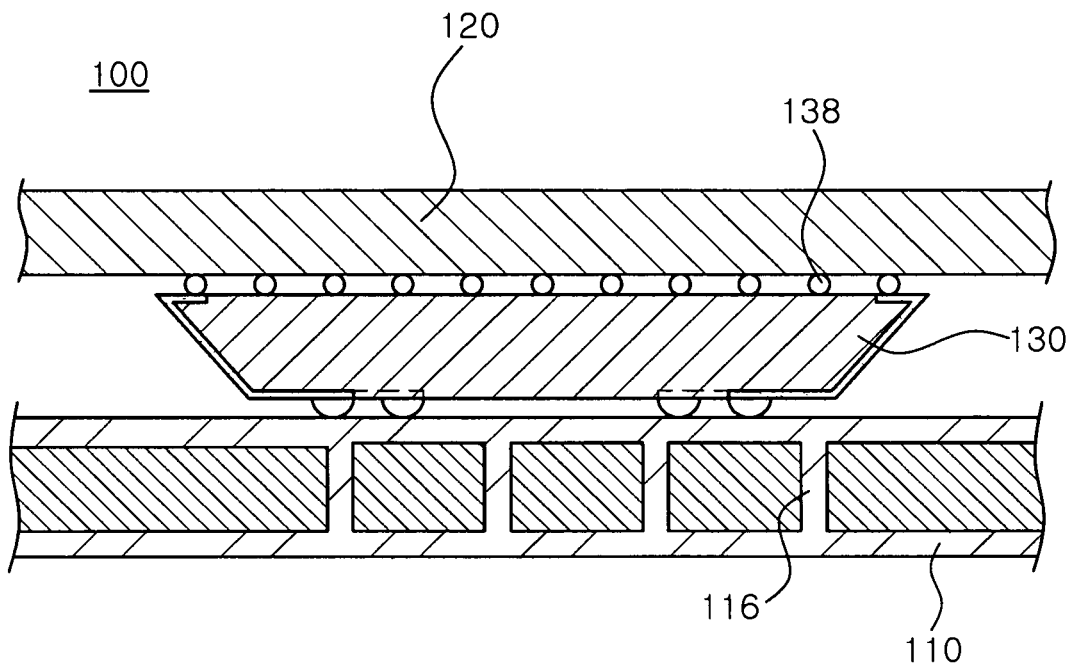
FIG. 1 is a cross-sectional view illustrating a semiconductor package according to an exemplary embodiment of the present invention.

An interconnection structure, an interposer, a semiconductor package, and a method of manufacturing an interconnection structure according to exemplary embodiments of the invention will be described in more detail with reference to FIGS. 1 through 6. Exemplary embodiments of the present invention will now be described in detail with reference to the accompanying drawings.

The invention may, however, be embodied in many different forms and should not be construed as being limited to the embodiments set forth herein. While those skilled in the art could readily devise many other varied embodiments that incorporate the teachings of the present invention through the addition, modification or deletion of elements, such embodiments may fall within the scope of the present invention.

In the drawings, the shapes and dimensions may be exaggerated for clarity, and the same reference numerals will be used throughout to designate the same or like components.

Figure 2:
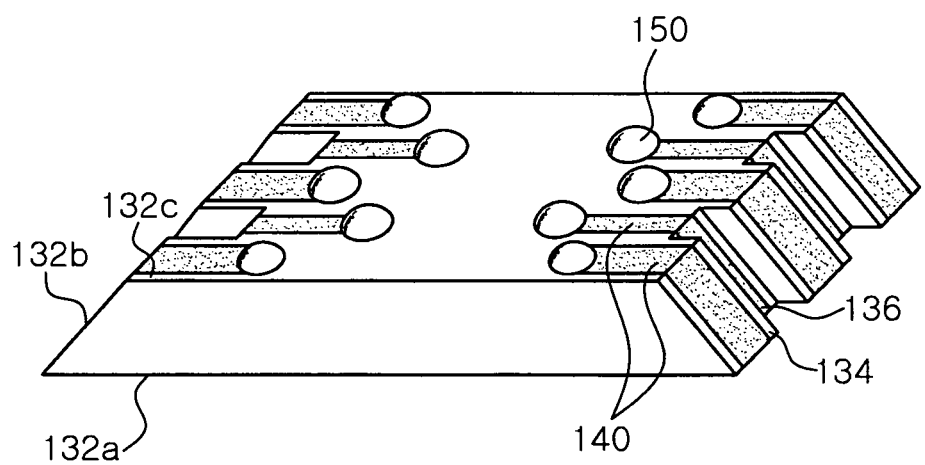
FIG. 2 is a cross-sectional view illustrating a semiconductor chip being mounted on the semiconductor package of FIG. 1.

FIG. 1 is a cross-sectional view illustrating a semiconductor package according to an exemplary embodiment of the present invention. FIG. 2 is a cross-sectional view illustrating a semiconductor chip being mounted on the semiconductor package of FIG. 1.

Referring to FIGS. 1 and 2, a semiconductor package 100 may include a circuit board 110, a semiconductor chip 120, and an interposer 130.

The circuit board 110 may be formed on a contact surface on which a pad portion to be electrically connected to the interposer 130 comes into contact with the interposer 130. A plurality of via portions 116 may be formed in the circuit board 110 so that the via portions 116 may be electrically connected to the pad portion.

Here, a recess may be formed in the circuit board 110 so that the interposer 130 is received within the recess thereof. Here, the recess may be formed in the circuit board 110 by dry etching or wet etching.

Here, via holes are formed to thereby expose the pad portion to the outside, and are then filled with a conductive material to thereby form the via portions 116. Further, the via portions 116 may be electrically connected to a circuit pattern that is formed on the circuit board 110.

The semiconductor chip 120 is located at one side of the interposer 130 and is electrically connected to external terminals 138, shaped like balls, of the interposer 130. Here, as for the semiconductor chip 120, a plurality of semiconductor chips 120 may be formed on a substrate wafer.

Here, via holes may be formed in the semiconductor chip 120 by a known method, and a laser drilling method using carbon dioxide may be used.

As described above, the interposer 130 is located between the circuit board 110 and the semiconductor chip 120 so as to electrically connect the circuit board 110 and the semiconductor chip 120 to each other.

Here, the interposer 130 may include a top surface 132c, side surfaces 132b, and a bottom surface 132a. Here, the top surface 132c and the bottom surface 132a may be disposed so as to be parallel to each other. Here, the top surface 132c may have a smaller area than the bottom surface 132a. The side surfaces 132b refer to surfaces connecting the top surface 132c and the bottom surface 132a to each other. The side surfaces 132b of the interposer 130 may be tapered due to the differences in area between the top and bottom surfaces 132c and 132a.

The interposer 130 may have an insulating layer formed over a surface thereof and cores within the insulating layer. Here, the insulating layer may be used to match mechanical properties so as to compensate differences in thermal expansion coefficients of electrode pattern portions 140, solder balls 150, and the cores. The insulating layer may include at least one layer such as a dielectric layer or a passivation layer.

A cover plate may be attached to the bottom surface of the interposer 130. Specifically, a cover plate, formed of a transparent material, may be attached by an adhesive, for example, a transparent epoxy layer. However, the cover plate may be removed.

The interposer 130 may have side portions 134, substantially the same as the surface of the side surfaces 132b, and cavities 136 recessed inwards from the side portions 134.

The cavities 136 have a height different from that of the side portions 134. The cavities and the side portions 134 are arranged in a zigzag pattern on each of the side surfaces 132b of the interposer 130.

Here, a process of forming the shapes of the cavities 136 and the side portions 134 may be simply performed by chemical etching.

Furthermore, when the electrode pattern portions 140 are formed on one surface of the interposer 130, the electrode pattern portions 140 may be formed into a pattern by rerouting plating. Here, the electrode pattern portions 140, formed into the pattern, may have a shape of, for example, circuit wiring provided so as to establish electrical connections.

The electrode pattern portions 140 may extend from the side surfaces 132b of the interposer 130 to the top surface 132c thereof. The solder balls 150 may be individually formed on one set of ends of the electrode pattern portions 140 formed on the top surface 132c of the interposer 130.

The solder balls 150 may be replaced with contacts appropriate for ACF engagement or may include ball grid array contacts.

Here, when the electrode pattern portions 140 are generally formed on the side surface of the interposer 130, in the case that the electrode pattern portions 140 are not separated from each other, they may electrically communicate with each other to thereby cause short circuits. Thus, the electrode pattern portions 140 are designed to be separated from each other by a predetermined distance.

However, in this embodiment, the cavities 136 and the side portions 134 have heights different from each other and are arranged in a zigzag pattern. Therefore, even though the cavities 136 and the side portions 134 are not designed to be separated from each other by a predetermined distance, electrical communications therebetween can be avoided due to the difference in the heights of the configurations. Therefore, fine pitch electrical interconnections can be realized by a simple etching process to thereby obtain economic efficiency.

Furthermore, in this embodiment, the electrode pattern portions 140 are formed on the side surfaces according to a side wall method, thereby reducing the manufacturing costs thereof.

However, the interposer 130 may be removed. Therefore, in the case that the interposer 130 is removed, the interconnection structure including the plurality of side portions 134, the plurality of cavities 136, located between the side portions 134, and located further inward than the side portions 134, and the electrode pattern portions 140, formed on the surfaces of the side portions 134 and the cavities 136, may be provided at least one of the semiconductor chip, the circuit board, and the MEMS.

Figure 3:
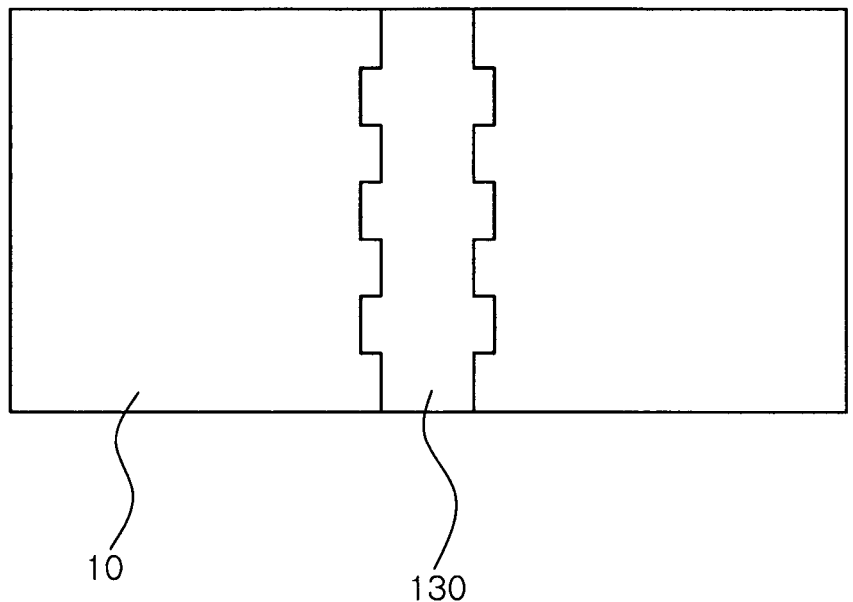
FIG. 3 is a plan view illustrating a method of manufacturing a semiconductor package according to an exemplary embodiment of the present invention.
Figure 4:
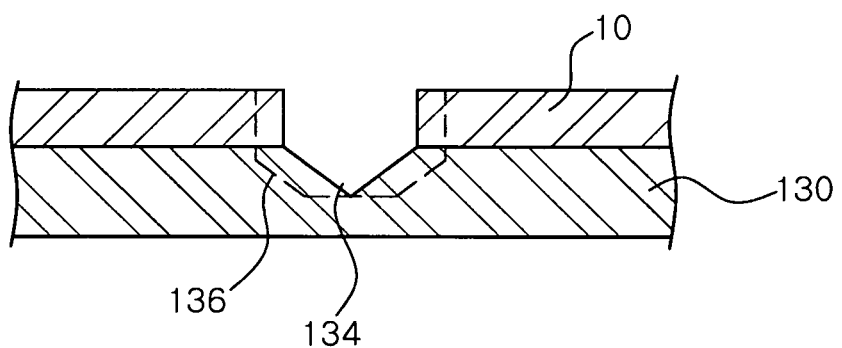
FIGS. 4 and 5 are cross-sectional views illustrating a method of manufacturing a semiconductor package according to an exemplary embodiment of the present invention.
Figure 5:
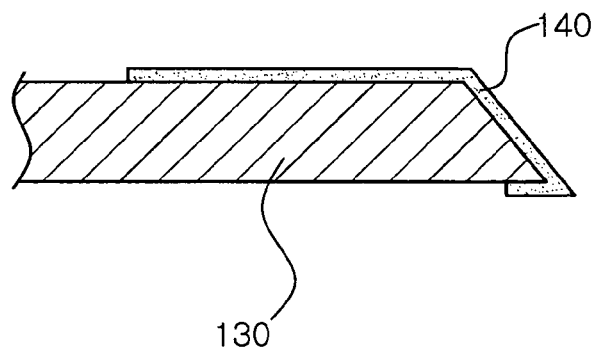

FIG. 3 is a plan view illustrating a method of manufacturing a semiconductor package according to an exemplary embodiment of the invention. FIGS. 4 and 5 are cross-sectional views illustrating a method of manufacturing a semiconductor package according to an exemplary embodiment of the invention.

Referring to FIGS. 3 through 5, according to a method of manufacturing a semiconductor package, an etching passivation layer 10 may be formed on the interposer 130.

Here, the invention is not limited to the interposer in order to establish an electrical connection for the semiconductor package. The above-described interconnection structure may also be formed on the circuit board, the semiconductor chip, the IC chip, and the MEMS rather than the interposer.

Here, the etching passivation layer 10 may be formed on the interposer 130 such that portions, forming the side portions 134, may be opened wider than other portions, forming the cavities 136.

The cavities 136 may be formed between the side portions 134 on the interposer 130 by an etching process.

Here, during the etching process, the interposer 130 is etched according to a crystal orientation thereof so that the side surfaces 132b may be formed into a tapered configuration.

Then, as shown in FIG. 5, the electrode pattern portions 140 may be formed on the side portions 134 and the cavities 136. Here, the electrode pattern portions 140 extend from the bottom surface of the interposer 130 to the top surface thereof.

Here, the process of forming the electrode pattern portions 140 is not limited thereto. The electrode pattern portions 140 may be formed on the interposer 130, and the circuit board may then be bonded to the interposer 130.

Furthermore, as described above, the circuit board 110 and the semiconductor chip 120 may be electrically connected to each other through the interposer 130.

Figure 6:
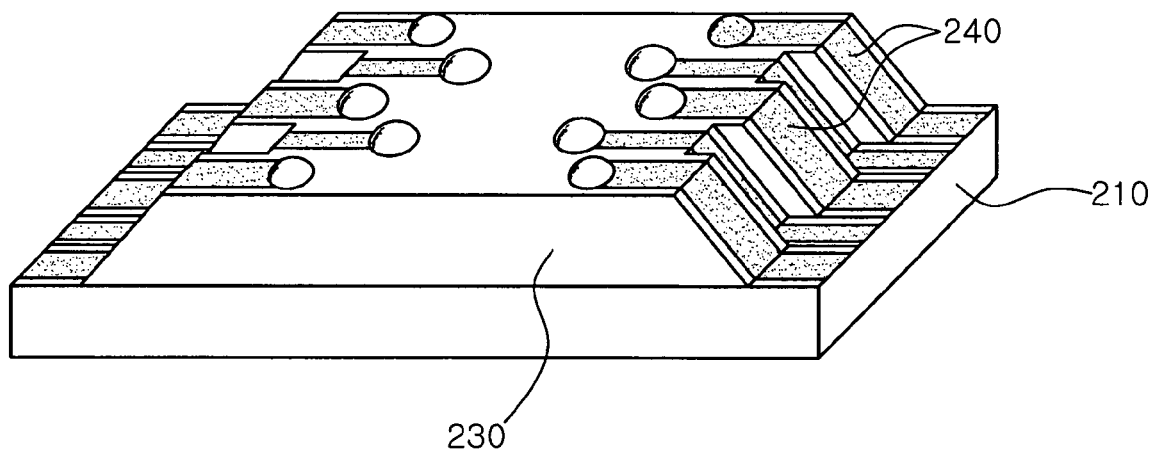
FIG. 6 is a schematic perspective view illustrating a method of manufacturing a semiconductor package according to another exemplary embodiment of the present invention.

FIG. 6 is a schematic perspective view illustrating a method of manufacturing an interconnection structure according to another exemplary embodiment of the invention.

Here, a method of manufacturing the interconnection structure is substantially the same as the above-described method. Thus, a description of overlapping parts will be omitted.

Referring to FIG. 6, according to a process of forming electrode pattern portions 240, after an interposer 230 is attached to an external device 210, such as a MEMS or ISM device, the electrode pattern portions 240 are formed on both the interposer 230 and the device 210 at the same time.

Therefore, according to the method of manufacturing a semiconductor package according to this embodiment, cavities and side portions, arranged in a zigzag pattern, can be simply manufactured to thereby increase economic efficiency.

As set forth above, according to exemplary embodiments of the invention, according to an interconnection structure, an interposer, a semiconductor, and a method of manufacturing the interconnections structure, electrode pattern portions are individually formed on the respective surfaces of cavities and side portions, arranged in a zigzag pattern, thereby allowing for fine pitch electrical interconnections when a circuit board and a semiconductor chip are electrically connected to each other.

While the present invention has been shown and described in connection with the exemplary embodiments, it will be apparent to those skilled in the art that modifications and variations can be made without departing from the spirit and scope of the invention as defined by the appended claims.

What is claimed is:

1. An interconnection structure comprising: a plurality of side portions connecting a top surface and a bottom surface of a substrate part; a plurality of cavities located between the side portions and recessed inward from the side portions, the side portions and the cavities having tapered surfaces; and electrode pattern portions provided on surfaces of the side portions and the cavities, wherein the electrode pattern portions provided on surfaces of the cavities are located further inward than the electrode pattern portions provided on surfaces of the side portions to be separated therefrom by a predetermined distance, wherein the surfaces of the cavities are disposed in parallel with the surfaces of the side portions, and wherein the top surface of the substrate part has an area different from that of the bottom surface of the substrate part.

2. An interposer comprising:
a substrate part having a plurality of side portions connecting a top surface and a bottom surface of the substrate part; a plurality of cavities located between the side portions and recessed inward from the side portions, the side portions and the cavities having tapered surfaces; and electrode pattern portions provided on surfaces of the side portions and the cavities to thereby electrically connect a circuit board and a semiconductor chip to each other, wherein the electrode pattern portions provided on surfaces of the cavities are located further inward than the electrode pattern portions provided on surfaces of the side portions to be separated therefrom by a predetermined distance, wherein the surfaces of the cavities are disposed in parallel with the surfaces of the side portions, and wherein the top surface of the substrate part has an area different from that of the bottom surface of the substrate part.

3. A semiconductor package comprising:
a semiconductor chip having an electrode portion on one surface thereof; a circuit board electrically connected to the semiconductor chip; and an interposer having a substrate part including a plurality of side portions connecting a top surface and a bottom surface of the substrate part and a plurality of cavities located between the side portions and recessed inward from the side portions, and electrode pattern portions provided on surfaces of the side portions and the cavities so as to electrically connect the circuit board and the semiconductor chip to each other, the side portions and the cavities having tapered surfaces, wherein the electrode pattern portions provided on surfaces of the cavities are located further inward than the electrode pattern portions provided on surfaces of the side portions to be separated therefrom by a predetermined distance, wherein the surfaces of the cavities are disposed in parallel with the surfaces of the side portions, and wherein the top surface of the substrate part has an area different from that of the bottom surface of the substrate part.

4. A method of manufacturing an interconnection structure, the method comprising:
forming an etching passivation layer on a substrate part;
forming side portions connecting a top surface and a bottom surface of the substrate part;

forming cavities located between the side portions and recessed inward from the side portions, by performing etching on one surface of the substrate part, such that the side portions and the cavities have tapered surfaces; and forming electrode pattern portions on surfaces of the side portions and the cavities, wherein the electrode pattern portion provided on surfaces of the cavities are located further inward than the electrode pattern portions provided on surface of the side portions to be separated therefrom by a predetermined distance, wherein the surfaces of the cavities are disposed in parallel with the surfaces of the side portions, and wherein the top surface of the substrate part has an area different from that of the bottom surface of the substrate part.

5. The method of claim 4, wherein the substrate part is any one of a circuit board, a semiconductor chip, a micro-electro mechanical system (MEMS), an IC device, and an interposer.

* * * * *